(12) United States Patent  (10) Patent No.: US 8,453,021 B2
Moshayedi et al.  (45) Date of Patent: *May 28, 2013

(54) WEAR LEVELING IN SOLID-STATE DEVICE

(75) Inventors: Mark Moshayedi, Newport Coast, CA (US); Seyed Jalal Sadr, Irvine, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/597,158

(22) Filed: Aug. 28, 2012

(65) Prior Publication Data

US 2012/0324299 A1    Dec. 20, 2012

Related U.S. Application Data

(63) Continuation-in-part of application No. 12/511,994, filed on Jul. 29, 2009, now Pat. No. 8,266,481.

(51) Int. Cl.
*G06F 11/08*    (2006.01)

(52) U.S. Cl.
USPC ............................................................ 714/710

(58) Field of Classification Search
USPC ......................................... 714/710, 723, 764
See application file for complete search history.

(56) References Cited

U.S. PATENT DOCUMENTS

| | | | |
|---|---|---|---|
| 5,956,473 A | 9/1999 | Ma et al. | |
| 6,226,202 B1 * | 5/2001 | Kikuchi | 365/185.33 |
| 6,279,118 B1 | 8/2001 | Kang | |
| 6,384,999 B1 * | 5/2002 | Schibilla | 360/53 |
| 6,587,915 B1 * | 7/2003 | Kim | 711/103 |
| 6,646,931 B2 | 11/2003 | Mizoguchi et al. | |
| 6,940,753 B2 | 9/2005 | Cernea | |
| 7,136,978 B2 | 11/2006 | Miura et al. | |
| 7,343,535 B2 | 3/2008 | Lai | |
| 7,430,693 B2 | 9/2008 | Noguchi et al. | |
| 7,447,936 B2 | 11/2008 | Shiota et al. | |
| 7,594,067 B2 | 9/2009 | Torabi | |
| 7,613,880 B2 | 11/2009 | Miura et al. | |
| 7,826,263 B2 | 11/2010 | Lee et al. | |
| 7,962,801 B2 | 6/2011 | Cheng | |
| 8,046,645 B2 | 10/2011 | Hsu et al. | |
| 8,069,396 B2 | 11/2011 | Chen et al. | |
| 2007/0233752 A1 | 10/2007 | Bangalore et al. | |
| 2008/0294935 A1 | 11/2008 | Ni et al. | |
| 2009/0055680 A1 | 2/2009 | Honda et al. | |
| 2009/0172255 A1 | 7/2009 | Yeh et al. | |
| 2009/0216936 A1 | 8/2009 | Chu et al. | |
| 2009/0271567 A1 | 10/2009 | Huang | |
| 2010/0023675 A1 | 1/2010 | Chen et al. | |
| 2010/0115186 A1 | 5/2010 | Chang et al. | |
| 2010/0115217 A1 | 5/2010 | Oh et al. | |
| 2011/0041005 A1 | 2/2011 | Selinger | |

* cited by examiner

*Primary Examiner* — James C Kerveros
(74) *Attorney, Agent, or Firm* — McDermott Will & Emery LLP

(57) ABSTRACT

A flash storage device performs wear-leveling by tracking data errors that occur when dynamic data is read from a storage block of the flash storage device and moving the dynamic data to an available storage block of the flash storage device. Additionally, the flash storage device identifies a storage block containing static data and moves the static data to the storage block previously containing the dynamic data.

20 Claims, 12 Drawing Sheets

130 ⤴

| $200_2$ Logical Block Address | $205_1$ Physical Block Address |
|---|---|
| $200_1$ Logical Block Address | $205_2$ Physical Block Address |
| $200_5$ Logical Block Address | $205_3$ Physical Block Address |
| ⋮ | ⋮ |
| $200_n$ Logical Block Address | $205_n$ Physical Block Address |

FIG. 2

| $205_1$ Physical Block Address | $300_1$ Block Status Indicator | $305_1$ Read Status Indicator | $310_1$ Write Status Indicator | $315_1$ Error Status Indicator | $320_1$ Free Storage Block indicator |
|---|---|---|---|---|---|
| $205_2$ Physical Block Address | $300_2$ Block Status Indicator | $305_2$ Read Status Indicator | $310_2$ Write Status Indicator | $315_2$ Error Status Indicator | $320_2$ Free Storage Block indicator |
| $205_3$ Physical Block Address | $300_3$ Block Status Indicator | $305_3$ Read Status Indicator | $310_3$ Write Status Indicator | $315_3$ Error Status Indicator | $320_3$ Free Storage Block indicator |
| $205_4$ Physical Block Address | $300_4$ Block Status Indicator | $305_4$ Read Status Indicator | $310_4$ Write Status Indicator | $315_4$ Error Status Indicator | $320_4$ Free Storage Block indicator |
| $205_5$ Physical Block Address | $300_5$ Block Status Indicator | $305_5$ Read Status Indicator | $310_5$ Write Status Indicator | $315_5$ Error Status Indicator | $320_5$ Free Storage Block indicator |
| $205_n$ Physical Block Address | $300_n$ Block Status Indicator | $305_n$ Read Status Indicator | $310_n$ Write Status Indicator | $315_n$ Error Status Indicator | $320_n$ Free Storage Block indicator |

| $500_2$ Virtual Block Address | $200_1$ Logical Block Address |
|---|---|
| $500_3$ Virtual Block Address | $200_2$ Logical Block Address |
| $500_5$ Virtual Block Address | $200_4$ Logical Block Address |
| ⋮ | ⋮ |
| $500_p$ Virtual Block Address | $200_p$ Logical Block Address |

FIG. 5A

WEAR LEVELING IN SOLID-STATE DEVICE

CROSS-REFERENCE TO RELATED APPLICATIONS

This application is a continuation-in-part of U.S. patent application Ser. No. 12/511,994, filed on Jul. 29, 2009, now U.S. Pat. No. 8,266,481, and entitled "System and Method of Wear-Leveling in Flash Storage," the entirety of which is incorporated by reference herein.

BACKGROUND

The present disclosure generally relates to flash storage systems and devices, and more particularly to wear-leveling in flash storage systems and devices.

A typical flash storage device includes a controller that writes data to storage blocks of the flash storage device and reads data from these storage blocks. In a write operation to a storage block, the controller erases the storage block before data is written to that storage block. Eventually, after a sufficient number of erases of the storage block, the storage block becomes defective and the controller replaces the defective storage block with a spare storage block in the flash storage device.

Wear in a storage block is determined by the number of erases of the storage block. Some flash storage devices include a counter for each storage block for maintaining a count of erases of the storage block. The controller uses the counter to perform wear-leveling in the flash storage device. In this process, the controller counts the number of erases of each storage block and attempts to write data to those storage blocks that have a lower erase count than the erase count of other storage blocks. In this way, the lifetimes of individual storage blocks in the flash storage device, as well as the lifetime of the flash storage device, are increased. Because, each of the counters typically has a number of bits sufficient to count up to a predicted number of erases before the storage block becomes defective, the counters consume significant area and power in a flash storage device.

In light of the above, a need exists for an improved system and method of performing wear-leveling in flash storage systems and devices.

SUMMARY

In various embodiments, a flash storage device performs wear-leveling on storage blocks in the flash storage device. The flash storage device includes a flash controller that detects and tracks data errors occurring when dynamic data is read from a storage block of the flash storage device. When a read data error occurs, the controller is configured to correct the data error. The controller is also configured to determine if the number of data errors associated with the storage block exceeds a threshold value. If the number of data errors exceeds the threshold value, the flash controller moves the dynamic data to an available storage block in the flash storage device. Additionally, the flash controller identifies a storage block in the flash storage device, which contains static data. The flash controller moves the static data to the storage block previously containing the dynamic data. Moving the static data to the storage block previously containing the dynamic data reduces the number subsequent erases of that storage block, which increases the lifetimes of the storage block and the flash storage device.

A flash storage device, in accordance with one embodiment, includes a controller and a plurality of storage blocks. The controller is configured to read a first data unit from a first storage block of the plurality of storage blocks. The controller is also configured to determine if a data error has occurred as a result of reading the first data unit from the first storage block, and if the first data unit includes dynamic data. The controller is further configured to correct the data error in the first data unit, move the first data unit from the first storage block to an available storage block. Additionally, the controller is configured to select a second storage block of the plurality of storage blocks. The second storage block contains a second data unit including static data. The controller is further configured to move the second data unit from the second storage block to the first storage block.

A method of wear-leveling in a flash storage device, in accordance with one embodiment, includes reading a first data unit from a first storage block of a plurality of storage blocks in the flash storage device. The method also includes determining if a data error has occurred as a result of reading the first data unit from the first storage block. If a data error has occurred, the method includes a step of correcting the data error and maintaining a count of the data error. The method further includes determining if the first data unit includes dynamic data. The method further includes moving the first data unit from the first storage block to an available storage block. Additionally, the method includes moving a second data unit containing static data from a second storage block to the first storage block.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

FIG. 2 is a block diagram of a logical block address table, in accordance with an embodiment of the present disclosure;

FIG. 3 is a block diagram of a status table, in accordance with an embodiment of the present disclosure;

FIG. 5A is a block diagram of a virtual address table, in accordance with an embodiment of the present disclosure;

DESCRIPTION

One indicator of wear in a storage block of the flash storage device is the number of erases of the storage block. A storage block is erased in an erase operation before data is written to the storage block in a write operation. Data that is written to a storage block in multiple write operations is referred to as dynamic data because the data changes in the storage block as a result of each of the write operations. Thus, a storage block that contains dynamic data is a storage block that has been erased multiple times as a result of the multiple write operations. Although an erase operation may be performed on a storage block after reading data from the storage block in a read operation, data often remains in the storage block for subsequent read operations on the storage block. Data that remains unchanged in a storage block after the data is initially written to the storage block is referred to as static data. Once data is written to the storage block in a subsequent write operation, however, the data is referred to as dynamic data.

A data error that occurs when reading data from a storage block of a flash storage device is another indicator of wear in the storage block because such a data error often occurs after a large number of erase operations have been performed on the storage block. Moreover, the storage block often becomes defective after a relatively small number of erase operations are performed on the storage block after the data error occurs.

In various embodiments, a flash storage device performs wear-leveling by tracking data errors occurring when dynamic data is read from a storage block of the flash storage device and moving the dynamic data to an available storage block of the flash storage device. Additionally, the flash storage device identifies a storage block in the flash storage device containing static data and moves the static data to the storage block previously containing the dynamic data. In this way, the flash storage device reduces the number of subsequent erase operations to the storage block previously containing the dynamic data, which increases the lifetime of the storage block and the flash storage device.

Figure 1A:
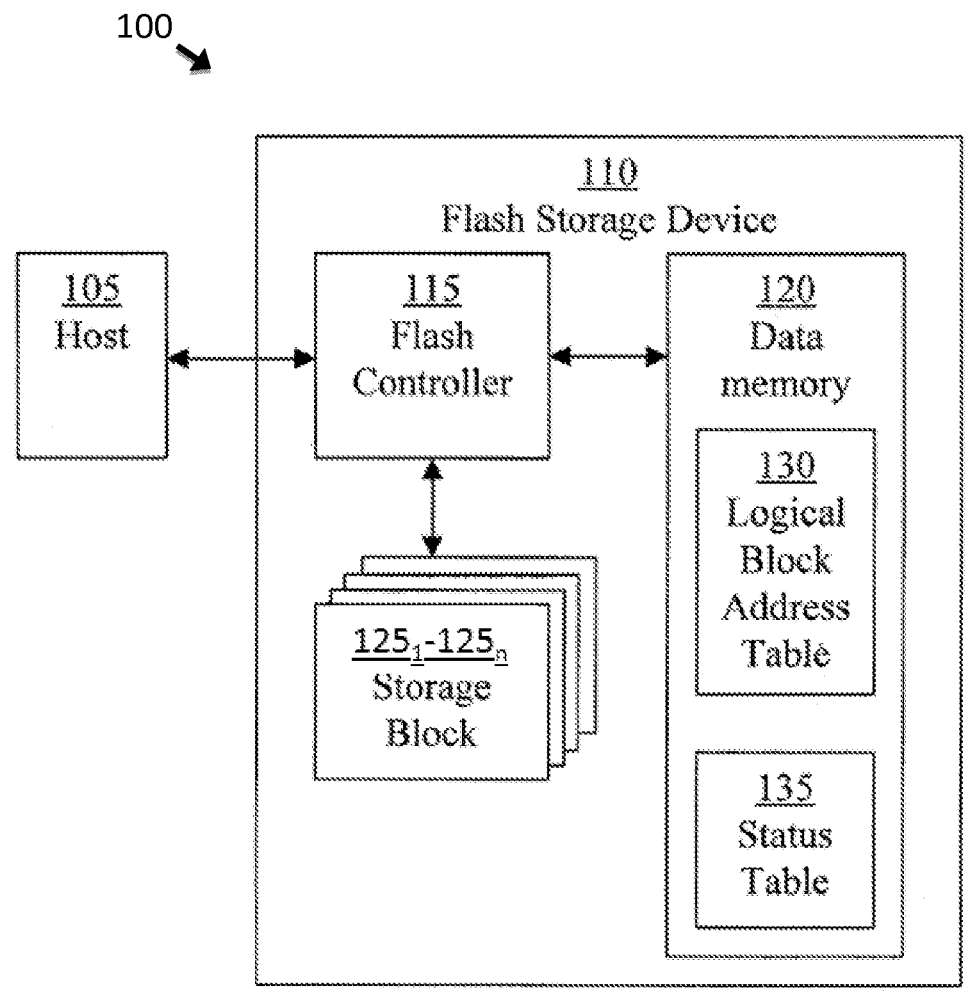
FIG. 1A is block diagram of an electronic system including a flash storage device, in accordance with an embodiment of the present disclosure.

FIG. 1A illustrates an electronic system 100, in accordance with an embodiment of the present disclosure. The electronic system 100 includes a flash storage device 110 and a host 105 coupled to the flash storage device 110. The host 105 writes data to the flash storage device 110 and reads data from the flash storage device 110. The flash storage device 110 includes a flash controller 115, a data memory 120, and storage blocks $125_1$-$125_n$. The data memory 120 and the storage blocks $125_1$-$125_n$ are each coupled to the flash controller 115. The flash storage device 110 also includes a logical block address table 130 and a status table 135. As illustrated in FIG. 1A, the data memory 120 includes the logical block address table 130 and the status table 135. In other embodiments, the logical block address table 130 or the status table 135, or both, may be external of the data memory 120. For example, the flash controller 115 or the storage blocks $125_1$-$125_n$ may include the logical block address table 130 or the status table 135, or both, in other embodiments.

The host 105 may be any computing or electronic device, such as a computer workstation, an embedded computing system, a network router, a portable computer, a personal digital assistant, a digital camera, a digital phone, or the like. The flash controller 115 may include a microprocessor, a microcontroller, an embedded controller, a logic circuit, software, firmware, or any kind of processing device. The flash storage device 110 may be any type of flash storage, such as a flash storage system, a solid-state drive, a flash memory card, a secure digital (SD) card, a universal serial bus (USB) memory device, a flash storage array, a CompactFlash card, SmartMedia, a flash storage array, or the like.

The data memory 120 may be any memory, computing device, or system capable of storing data. For example, the data memory 120 may be a random access memory (RAM), a dynamic random access memory (DRAM), a static random access memory (SRAM), a synchronous dynamic random access memory (SDRAM), a flash storage, an erasable programmable read-only-memory (EPROM), an electrically erasable programmable read-only-memory (EEPROM), or the like. Each of the storage blocks $125_1$-$125_n$ may be any type of nonvolatile storage such as, for example, a flash storage block. Each of the storage blocks $125_1$-$125_n$ has a data size, which determines the capacity of the storage block to store data. For example, the data size of a storage block may be a data bit, a data byte, a data word, a data block, a data record, a data file, a data sector, a memory page, a logic sector, or a file sector, or any other unit of data. Although four storage blocks are illustrated in FIG. 1, the flash storage device 110 may have more or fewer storage blocks in other embodiments.

Figure 1B:
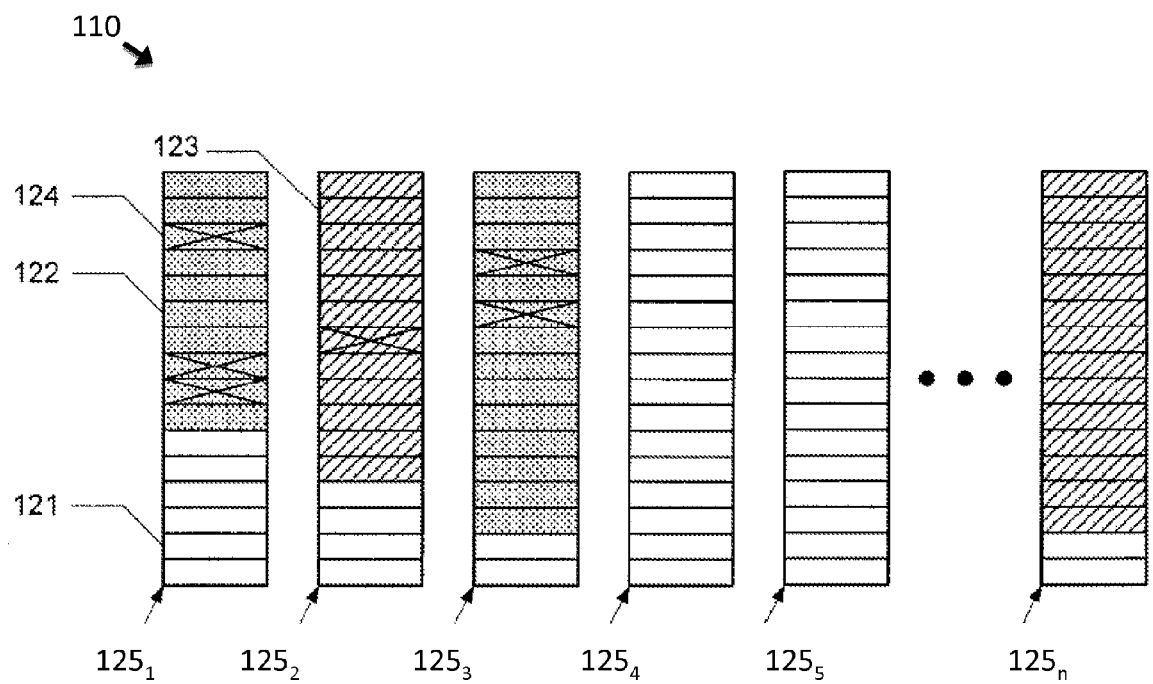
FIG. 1B illustrates storage blocks in a flash storage device, in accordance with an embodiment of the present disclosure.

Referring to FIG. 1B, a block diagram of storage blocks in a flash storage device according to one aspect of the subject disclosure is depicted. Flash storage device 110 includes a number of storage blocks $125_1$-$125_n$. While the term "storage block" is used throughout the description, it will be understood by those of skill in the art that the term storage block is frequently used interchangeably with the term "data block" or "memory block" in the art. Each storage block has a plurality of data units for storing data. In the present exemplary flash storage device, each storage block is illustrated as including 16 data units. The scope of the present disclosure, however, is not limited to such an arrangement. Rather, as will be apparent to one of skill in the art, a storage block may be configured with more or less than 16 data units as desired to provide various levels of storage space. For example, in accordance with one aspect of the subject disclosure, a storage block may include 32 data units of 4 kilobytes (kB) each to provide 128 kB of data storage. While data blocks are usually configured with 2n data units (e.g., 16, 32, 64, 128, 256, etc.), the scope of the invention is not so limited. Similarly, while each storage block $125_1$-$125_n$ is illustrated as including the same number of data units, the scope of the invention is not so limited, as a flash storage device may comprise a number of data blocks with differing capacities and/or numbers of data units. In accordance with another aspect, a storage block is stored on a single flash memory chip in a storage array of multiple flash memory chips.

Three types of data units are illustrated with different graphical conventions in FIG. 1B. Empty data units, such as data unit 121, are indicated by an empty or white field. Data units containing dynamic data (e.g., data which is frequently updated or rewritten), such as data unit 122, are indicated by a shaded field. Data units containing static data (e.g., data which is infrequently updated or rewritten), such as data unit 123, are indicated by a field with diagonal hatches. In addition, a data unit containing data which has become corrupted or is otherwise erroneous, such as data unit 124, is indicated by intersecting diagonal black lines.

In various embodiments, the flash controller 115 writes data (e.g., data units) to the data memory 120 and the storage blocks $125_1$-$125_n$ and reads data from the data memory 120 and the storage blocks $125_1$-$125_n$. Additionally, the flash controller 115 generates error correction codes (ECC) for data in the flash storage device 110. In one embodiment, the flash controller 115 generates an error correction code (ECC) for data in the flash storage device 110 in conjunction with performing a write operation for writing the data to storage block $125_1$, for example. Further, the flash controller 115 writes the error correction code associated with the data to the storage block $125_1$.

According to one aspect of the subject disclosure, upon a read operation of storage block $125_1$, the flash controller 115 may be configured to use the error correction codes to determine whether data errors occur when the flash controller 115 reads data from the storage blocks $125_1$. A data error occurs if one or more data bits of the data read from the storage block $125_1$ or more specifically, from data unit 124 by the flash controller 115 are corrupt. Data unit 124 contains data that has become corrupted or is otherwise erroneous. If a data error occurs when the flash controller 115 reads data from the storage blocks $125_1$, the flash controller 115 corrects the data error in data unit 124 by using the error correction code previously generated for the data. After correcting the data error, controller 115 may be configured to move the data from data unit 124 (or the entire storage block $125_1$) to one or more data units of an available data block, such as data block $125_4$. Controller 115 may be further configured to move data (e.g., from a single data unit, or from multiple data units) which has been determined to be static data from one or more data units of another data block, such as storage block $125_2$, to one or more data units of storage block $125_1$. In accordance with one aspect of the subject disclosure, controller 115 is configured to move data by first copying the data from the data unit(s) of one data block to the data unit(s) of another data block, and then deleting the first data block.

In addition, the flash controller 115 maintains a count of the number of data errors occurring in read operations for each of the storage blocks $125_1$-$125_n$. If the flash controller 115 determines the number of data errors occurring in read operations of a given storage block containing dynamic data exceeds a threshold value, the flash controller 115 selects an available storage block and moves the dynamic data to the available storage block. Further, the flash controller 115 may select a storage block containing static data and move the static data to the storage block previously containing the dynamic data. In this way, the controller performs wear-leveling in the flash storage device 110.

Figure 1C:
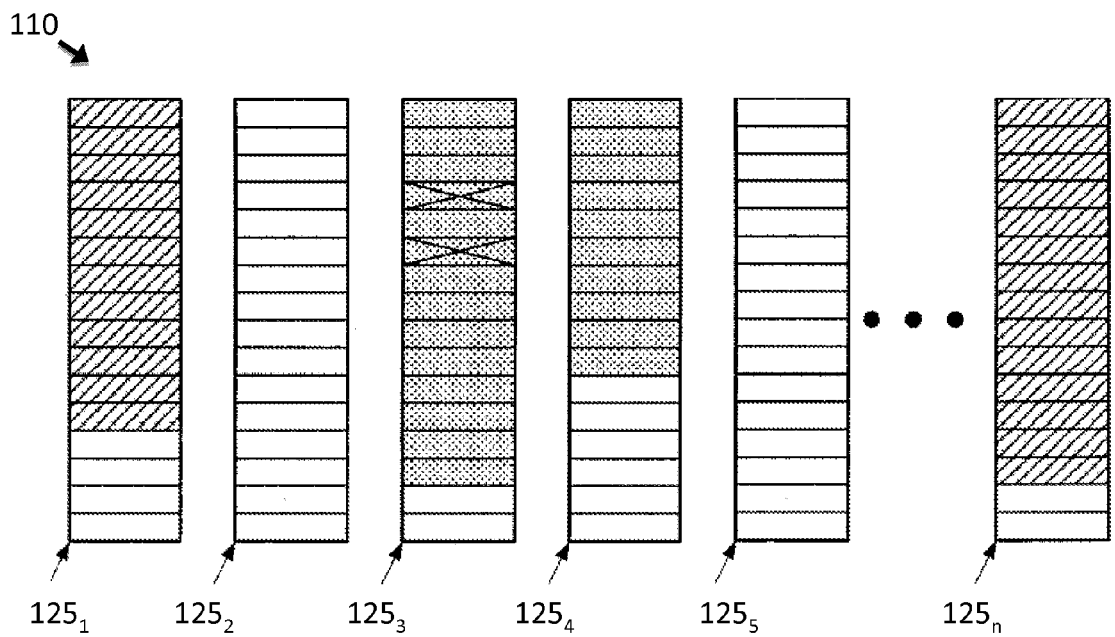
FIG. 1C illustrates storage blocks in a flash storage device, in accordance with another embodiment of the present disclosure.

The foregoing operation may be more easily understood with reference to FIG. 1C, which illustrates flash storage device 110 after the above described operations have been completed, in accordance with one aspect of the subject disclosure. As can be seen with reference to FIG. 1C, the dynamic data previously located in the data units of storage block $125_1$ have been moved to data units of storage block $125_4$, while the static data previously located in the data units of storage block $125_2$ have been moved to data units of storage block $125_1$. In various embodiments, the flash controller 115 is configured to perform error correction on all data units when moving the data from storage block $125_1$ to storage block $125_4$ and from storage block $125_2$ to storage block $125_1$. As a result, storage blocks $125_4$ and $125_1$ contain all new and valid data after the above operations.

In some embodiments, the flash storage device 110 includes spare storage blocks, such as spare storage block $125_5$, for replacement of any defective storage block in the flash storage device 110. In these embodiments, the flash controller 115 determines whether any of the storage blocks $125_1$-$125_n$ is defective and maps the logical block address of the flash storage device 110 associated with such a defective storage block to the physical block address of a spare storage block.

FIG. 2 illustrates the logical block address table 130, in accordance with an embodiment of the present disclosure. The logical block address table 130 maps logical block addresses $200_1$-$200_n$ to physical block addresses $205_1$-$205_n$ of the storage blocks $125_1$-$125_n$ of flash storage device 110. In other embodiments, the logical block address table 130 may be another data structure, or may include software, or hardware, or both, that maps the logical block addresses $200_1$-$200_n$ of the flash storage device 110 to the physical block addresses $205_1$-$205_n$ of storage blocks $125_1$-$125_n$ in the flash storage device 110.

FIG. 3 illustrates the status table 135, in accordance with an embodiment of the present disclosure. The status table 135 includes physical block addresses $205_1$-$205_n$, block status indicators $300_1$-$300_n$, read status indicators $305_1$-$305_n$, write status indicators $310_1$-$310_n$, and error status indicators $315_1$-$315_n$ for each of the storage blocks $125_1$-$125_n$, respectively. In other embodiments, the status table 135 may be another data structure, or may include software, or hardware.

By way of example, block status indicator $300_1$ of a storage block $125_1$ indicates whether the storage block $125_1$ is defective. In operation, if flash controller 115 determines storage block $125_1$ is defective, the flash controller 115 replaces the defective storage block $125_1$ with a spare storage block (i.e., by moving data from storage block $125_1$ to the spare storage block), and sets the block status indicator $300_1$ of the defective storage block $125_1$ to indicate that the defective storage block $125_1$ is defective.

The read status indicators $305_1$-$305_n$ indicate whether the flash controller 115 has read data from the storage blocks $125_1$-$125_n$ since the flash storage device 110 was last powered-on. Write status indicator $310_1$ indicates whether the flash controller 115 has written data to the storage block $125_1$ since the flash storage device 110 was last powered-on. If write status indicator $310_1$ of storage block $125_1$ indicates the flash controller 115 has written data to the storage block $125_1$ since the flash storage device 110 was last powered-on, the storage block $125_1$ is deemed to contain dynamic data. If the write status indicator $310_1$ of a storage block $125_1$ indicates the flash controller 115 has not written data to the storage block $125_1$ since the flash storage device 110 was last powered-on, the storage block $125_1$ is deemed to contain static data. The error status indicators $315_1$-$315_n$ of storage blocks $125_1$-$125_n$ indicate the number of data errors that have occurred as a result the flash controller 115 reading data from storage blocks $125_1$-$125_n$. In an alternative embodiment, the error status indicators $315_1$-$315_n$ of storage blocks $125_1$-$125_n$ indicate the number of data errors that have occurred as a result of the flash controller 115 reading data from the storage blocks $125_1$-$125_n$ since the flash storage device 110 was last powered-on. For example, FIG. 1B illustrates storage block $125_1$ having three data units that have error. In this case, the error status indicator $315_1$ of storage block $125_1$ may have a value of three.

In one embodiment, the flash controller 115 resets the read status indicators $305_1$-$305_n$ and the write status indicators $310_1$-$310_n$ after the flash storage device 110 is powered-on and before the flash controller 115 reads data from, or writes data to, the storage blocks $125_1$-$125_n$. For example, each of the read status indicators $305_1$-$305_n$ and each of the write status indicators $310_1$-$310_n$ may include a data bit and the flash controller 115 sets each of these data bits to a value of zero. In a further embodiment, the flash controller 115 resets the error status indicator $315_1$-$315_n$ after the flash storage device 110 is powered-on but before the flash controller 115 reads data from, or writes data to, the storage blocks $125_1$-$125_n$. For example, the error status indicator $315_1$ may include one or more data bits and the flash controller 115 sets each of these data bits to a value of zero. In this embodiment, the error status indicator $315_1$ indicates the number of data errors that have occurred as a result the flash controller 115 reading data from the storage block $125_1$ since the flash storage device 110 was last powered-on.

In some embodiments, the status table 135 also includes optional free storage block indicators $320_1$-$320_n$. The free storage block indicators $320_1$-$320_n$ may contain the physical block addresses $205_1$-$205_n$ of available storage blocks $125_1$-$125_n$ in the flash storage device 110. In one embodiment, the free storage block indicator $320_4$ is set during manufacture of the flash storage device 110 to contain the physical block address $205_4$ of an available storage block, such as a spare storage block $125_4$, in the flash storage device 110. In this embodiment, the free storage block indicator $320_4$ also indicates whether the storage block $125_4$ associated with the physical block address $205_4$ in the free storage block indicator $320_4$ is available. Alternatively, the free storage block indicators $320_1$-$320_n$ may contain a flag or bit that is set to indicate which of storage blocks $125_1$-$125_n$ at the physical block addresses $205_1$-$205_n$ listed in the status table 135 are available.

In other embodiments, the flash controller 115 identifies an available storage block, such as spare storage block $125_5$, when the storage block $125_5$ associated with the physical block address $205_5$ in the free storage block indicator $320_5$ is used and becomes unavailable. In these embodiments, the controller updates the free storage block indicator $320_5$ to contain the physical block address $205_5$ of the identified storage block $125_5$. Although only one free storage block indicator $320_5$ and storage block $125_5$ are illustrated in FIGS. 1B, 1C, and 3, there may be other spare storage blocks and the status table 135 may contain more than one free storage block indicator in other embodiments.

In various embodiments, the flash controller 115 receives an operation from the host 105, which may be a read operation or a write operation, among others. Each of the read or write operations includes a logical block address of the flash storage device 110. Additionally, a write operation includes a data unit. For example, a data unit may be a data bit, a data byte, a data word, a data block, a data record, a data file, a data sector, a data segment, a memory page, a logic sector, or a file sector, or any other unit of data. If the operation received from the host 105 is a write operation that corresponds to storage block $125_2$, for example, the flash controller 115 determines physical block address $205_2$ of storage block $125_2$ based on the logical block address $200_1$ of the write operation and the logical block address table 130. The flash controller 115 then writes the data unit of the write operation to the storage block $125_2$ based on the physical block address $205_2$ of storage block $125_2$. Additionally, the flash controller 115 sets the write status indicator $310_2$ in the status table 135 to indicate the flash controller 115 has written data to the storage block $125_2$. For example, the flash controller 115 may set a data bit of the write status indicator $310_2$ to a value of one.

If the operation received from the host 105 is a read operation that corresponds to storage block $125_1$, for example, the flash controller 115 determines the physical block address $205_1$ of storage block $125_1$ based on the logical block address $200_2$ of the write operation and the logical block address table 130. The flash controller 115 then reads a data unit from the storage block $125_1$ based on the physical block address $205_1$ of that storage block $125_1$ and provides the data unit to the host 105. Additionally, the flash controller 115 sets the read status indicator $305_1$ in the status table 135 to indicate the flash controller 115 has read data from the storage block $125_1$. For example, the flash controller 115 may set a data bit of the read status indicator $305_1$ to a value of one.

Additionally, the flash controller 115 determines whether a data error occurs as a result of a read operation on any of the storage blocks $125_1$-$125_n$. For example, if a data error occurs as a result of the read operation on storage block $125_1$, the flash controller 115 corrects the data error in the data unit by using the error correction code previously generated for the data unit. The flash controller 115 then provides the data unit, which has been corrected, to the host 105. Additionally, the flash controller 115 updates the error status indicator $315_1$ of storage block $125_1$ to indicate a new count of the number of data errors occurring in read operations for the storage block $125_1$. For example, the flash controller 115 may modify one or more data bits of the error status indicator $315_1$ to increment the count of the error status indicator $315_1$.

If a data error occurs as a result of the read operation on a storage block $125_1$ for example, the flash controller 115 determines whether the storage block $125_1$ contains dynamic data. By way of example, flash controller 115 determines whether the count in the error status indicator $315_1$ of the storage block $125_1$ exceeds a threshold value and whether the write status indicator $310_1$ of the storage block $125_1$ is set. If the count in the error status indicator $315_1$ of the storage block $125_1$ exceeds the threshold value and the write status indicator $310_1$ of the storage block $125_1$ is set, the controller deems storage block $125_1$ to be a dynamic storage block. Additionally, as illustrated in FIGS. 1B and 1C, the flash controller 115 selects an available storage block $125_4$, writes the data unit from the dynamic storage block $125_1$ to the selected storage block $125_4$, erases the dynamic storage block $125_1$, and updates the logical block address table 130 such that the physical address associated with the dynamic storage block $125_1$ that previously contained dynamic data is mapped to the newly selected storage block $125_4$. In this way, the flash controller 115 moves the dynamic data from the storage block $125_1$ to the selected storage block $125_4$.

In addition to moving the data from the dynamic storage block $125_1$ to the selected storage block $125_4$, the flash controller 115 identifies a storage block that contains static data. In one embodiment, the flash controller 115 identifies the storage block $125_2$ containing the static data by identifying a write status indicator $310_2$ associated with the storage block $125_2$ that is not set in the status table 135. In another embodiment, the flash controller 115 identifies the storage block $125_2$ containing the static data by identifying a write status indicator $310_2$ associated with the storage block $125_2$ that is not set in the status table 135 and a read status indicator $305_2$ associated with the storage block $125_2$ that is set in the status table 135. The flash controller 115 then deems the identified storage block $125_2$ to be a static storage block. The flash controller 115 then reads the static data from the static storage block $125_2$ and writes the data to storage block $125_1$ that previously contained the dynamic data. Additionally, the flash controller 115 updates the logical block address table 130 such that the physical address associated with the static storage block $125_2$ is mapped to the storage block $125_1$. In some embodiments, the flash controller 115 also erases the static storage block $125_2$.

In some instances, the write status indicators $310_1$-$310_n$ of storage blocks $125_1$-$125_n$ in the flash storage device 110 may become set. In one embodiment, the flash controller 115 determines if the write status indicators $310_1$-$310_n$ of storage blocks $125_1$-$125_n$ in the flash storage device 110 are set based on the status table 135. By way of example, the flash controller 115 may identify storage block $125_2$ containing static data by identifying an error status indicator $315_2$ associated with the storage block $125_2$ that has a count less than the current threshold value.

In some instances, the error status indicators $315_1$-$315_n$ of storage blocks $125_1$-$125_n$ in the flash storage device 110 may become set. In one embodiment, the flash controller 115 determines if the error status indicators 315 of storage blocks $125_1$-$125_n$ in the flash storage device 110 are set based on the status table 135. In this embodiment, the flash controller 115 then increases the threshold value.

Figure 4:
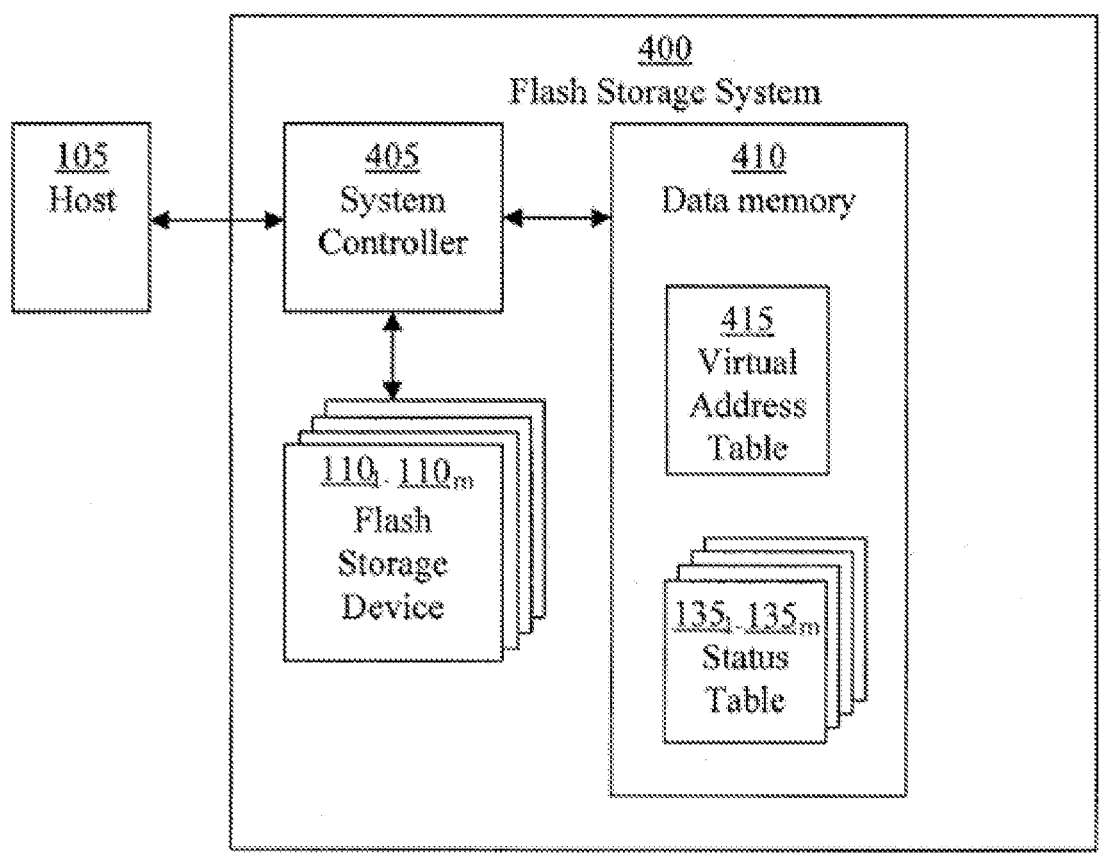
FIG. 4 illustrates an electronic system, in accordance with an embodiment of the present disclosure.

FIG. 4 illustrates the electronic system 100, in accordance with another embodiment of the present disclosure. The electronic system 100 includes a flash storage system 400. The flash storage system 400 includes a system controller 405, a data memory 410, and multiple flash storage devices $110_1$-$110_m$. The system controller 405 is coupled to the host 105, the data memory 410, and to each of the flash storage devices $110_1$-$110_m$. The system controller 405 may include a microprocessor, a microcontroller, an embedded controller, a logic circuit, software, firmware, or any kind of processing device. The data memory 410 may be any memory, computing device, or system capable of storing data. For example, the data memory 410 may be a random access memory (RAM), a dynamic random access memory (DRAM), a static random access memory (SRAM), a synchronous dynamic random access memory (SDRAM), a flash storage, an erasable programmable read-only-memory (EPROM), an electrically erasable programmable read-only-memory (EEPROM), or the like.

The data memory 410 includes the status tables $135_1$-$135_m$ of the flash storage devices $110_1$-$110_m$ and a virtual address table 415. By way of example, the system controller 405 instead of the individual flash controllers 115 maintains the status tables $135_1$-$135_m$ of the flash storage devices $110_1$-$110_m$. Although four flash storage devices and four status tables are illustrated in FIG. 4, the flash storage system 400 may have more or fewer flash storage devices $110_1$-$110_m$ or status tables $135_1$-$135_m$, or both, in other embodiments.

FIG. 5A illustrates the virtual address table 415, in accordance with an embodiment of the present disclosure. The virtual address table 415 maps virtual addresses $500_1$-$500_p$ to logical block addresses $200_1$-$200_p$ of the flash storage devices $110_1$-$110_m$. In various embodiments, the system controller 405 receives operations including virtual addresses $500_1$-$500_p$ from the host 105 and uses the virtual address table 415 to identify physical addresses of the flash storage devices $110_1$-$110_m$.

Figure 5B:
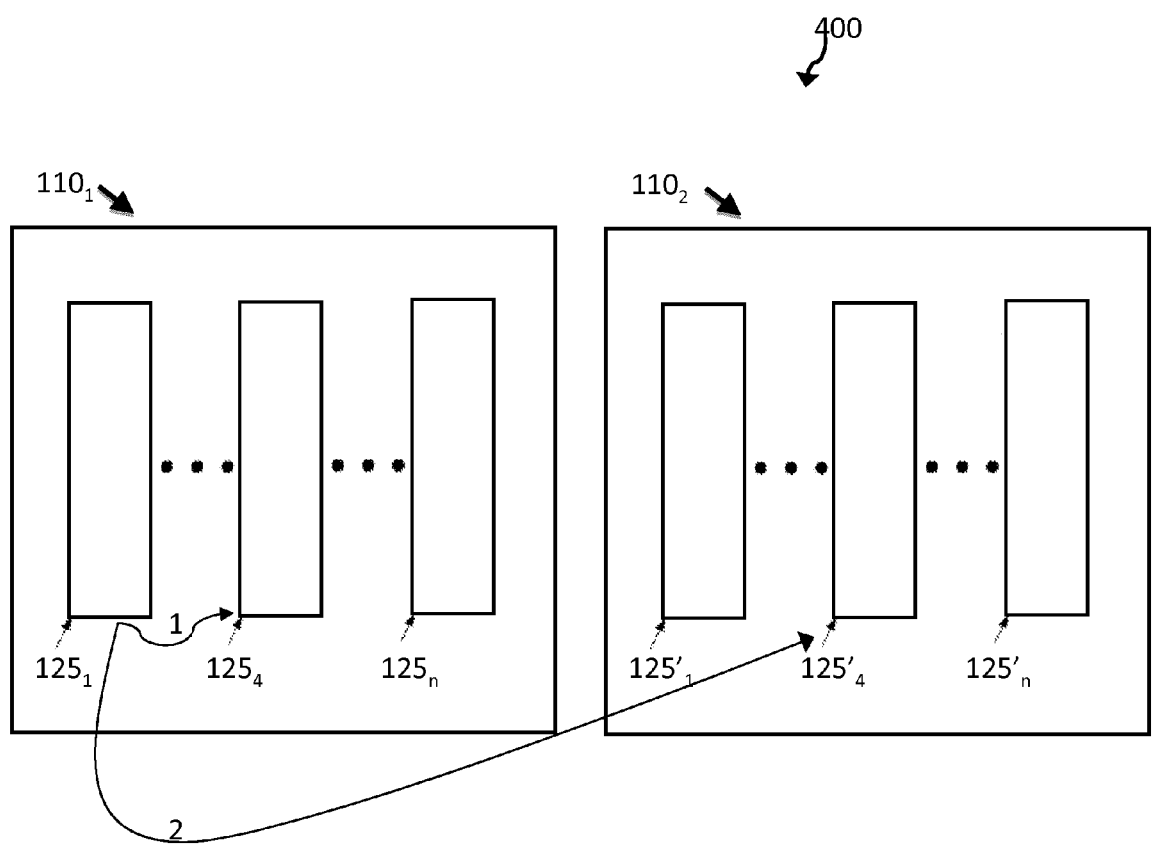
FIG. 5B illustrates two flash storage devices of a flash storage system, in accordance with an embodiment of the present disclosure.

Referring now to FIG. 5B, flash storage system 400 is shown to have flash storage device $110_1$ and flash storage device $110_2$. In one embodiment, if the system controller 405 determines a data error has occurred as a result of a read operation in a storage block $125_1$ of flash storage device $110_1$, the system controller 405 may select an available storage block $125_4$ in the same flash storage device $110_1$ for data transferring (i.e., selection 1). In another embodiment, if the system controller 405 determines a data error has occurred as a result of a read operation in a dynamic storage block $125_1$ of a flash storage device $110_1$, the system controller 405 may select an available storage block $125'_4$ of another flash storage device, such as flash storage device $110_2$ (i.e., selection 2). The system controller 405 may select the available storage block $125'_4$ if the flash storage device $110_1$ containing the dynamic storage block $125_1$ does not have an available storage block. The system controller 405 may also select the available storage block $125'_4$ in an effort to perform wear-leveling among the flash storage devices $110_1$-$110_m$. In the above described embodiment, system controller 405 then moves the data unit in the dynamical storage block $125_1$ to the available storage block $125'_4$ of the selected flash storage device $110_2$. Additionally, the system controller 405 uses the virtual address table 415 to map the virtual address associated with the old dynamic storage block in the previous flash storage device $110_1$ to the new storage block in the selected flash storage device $110_2$.

Figure 6A:
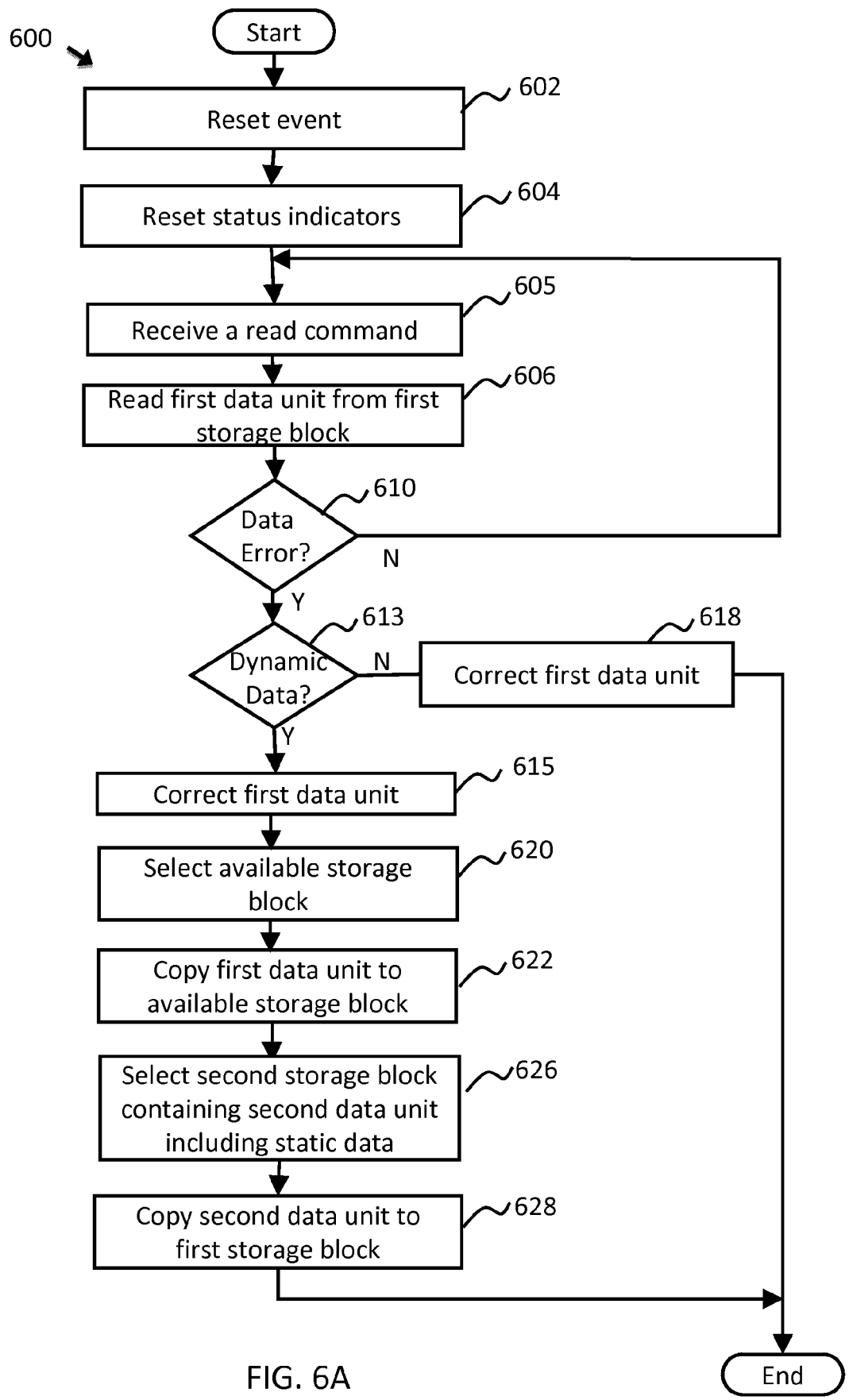
FIG. 6A is a flow chart for a method of wear-leveling in a flash storage device, in accordance with an embodiment of the present disclosure.

FIG. 6A illustrates a method 600 of wear-leveling in the flash storage device 100, in accordance with an embodiment of the present disclosure. In step 602, the flash storage device 110 is powered-on or experiences a reset event. The method 600 then proceeds to step 604.

In step 604, the controller 115 resets the read status indicators $305_1$-$305_n$ and the write status indicators $310_1$-$310_n$ in the status table 135. The flash controller 115 may also reset the error status indicators $315_1$-$315_n$ in the status table 135. In one embodiment, the flash controller 115 receives a read operation or command from the host 105 in step 605 and performs the read operation on the first storage block $125_1$ to read a first data unit from the storage block $125_1$ in step 606 based on the read operation or command. The method 600 then proceeds to step 610.

In step 610, the flash controller 115 determines whether a data error has occurred as a result of reading the first data unit from the first storage block $125_1$. If the controller determines a data error has occurred as a result of reading the first data unit from the first storage block $125_1$, the method 600 proceeds to step 613, otherwise the method 600 proceeds back to step 605 to wait for the next read operation or command.

In step 613, arrived at from the determination in step 610 that a data error has occurred in the first data unit, the flash controller 115 determines whether the first data unit includes dynamic data. In one embodiment, the flash controller 115 determines the first data unit contains dynamic data if the count in the error status indicator $315_1$ of the first block $125_1$ exceeds the threshold value and the write status signal $310_1$ of the storage block $125_1$ is set. If the flash controller 115 determines the first data unit contains dynamic data, the method 600 proceeds to step 615, otherwise the method 600 proceeds to step 618, where the flash controller 115 corrects the data error in the first data unit, sends the corrected data to the host, and the method 600 ends In step 615, the flash controller 115 corrects the data error in the first data unit. In one embodiment, the flash controller 115 uses an error correction code previously generated for the first data unit to correct the data error in the first data unit. The method 600 then proceeds to step 620.

In step 620, the flash controller 115 selects an available storage block $125_4$ in the flash storage device 110. For example, the available storage block $125_4$ may be a spare storage block. In one embodiment, the flash controller 115 uses a free storage block indicator $320_4$ in the status table 135 to select the available storage block $125_4$. The method 600 then proceeds to step 622.

In step 622, the flash controller 115 moves the data unit by copying the, data unit from storage block $125_1$, which has been corrected in step 615, to the selected storage block $125_4$. The flash controller 115 may also perform an erase operation on storage block $125_1$ at this stage. Additionally, the flash controller 115 updates the logical block address table 130. In this process, the flash controller 115 identifies the logical block address $200_2$ that was mapped to the original storage block $125_1$ and maps the logical block address $200_2$ to new storage block $125_4$ where the data has just been transferred. The method 600 then proceeds to step 626.

In step 626, the flash controller 115 selects a second storage block $125_2$ in the flash storage device 110, which contains a second data unit including static data. In one embodiment, the flash controller 115 selects the second storage block $125_2$ by identifying a write status indicator $310_2$ that is not set in the status table 135 and identifying the storage block $125_2$ associated with the write status indicator $310_2$. In another embodiment, the flash controller 115 selects the second storage block $125_2$ by identifying a write status indicator $310_2$ that is not set and a read status indicator $305_2$ that is set in the status table 135, and identifying the storage block $125_2$ associated with the write status indicator $310_2$ and the read status indicator $305_2$. The method 600 then proceeds to step 628.

In step 628, the flash controller 115 moves the second data unit from the second storage block $125_2$ to the first storage block $125_1$ by copying the data unit from storage block $125_2$ to storage block $125_1$, for example. Additionally, the flash controller 115 updates the logical block address table 130. In this process, the flash controller 115 identifies the logical block address $200_1$ that is mapped to the second storage block $125_2$ and maps the logical block address $200_1$ to the first storage block $125_1$. In one embodiment, the flash controller 115 then erases the second storage block $125_2$. The method 600 then ends.

Figure 6B:
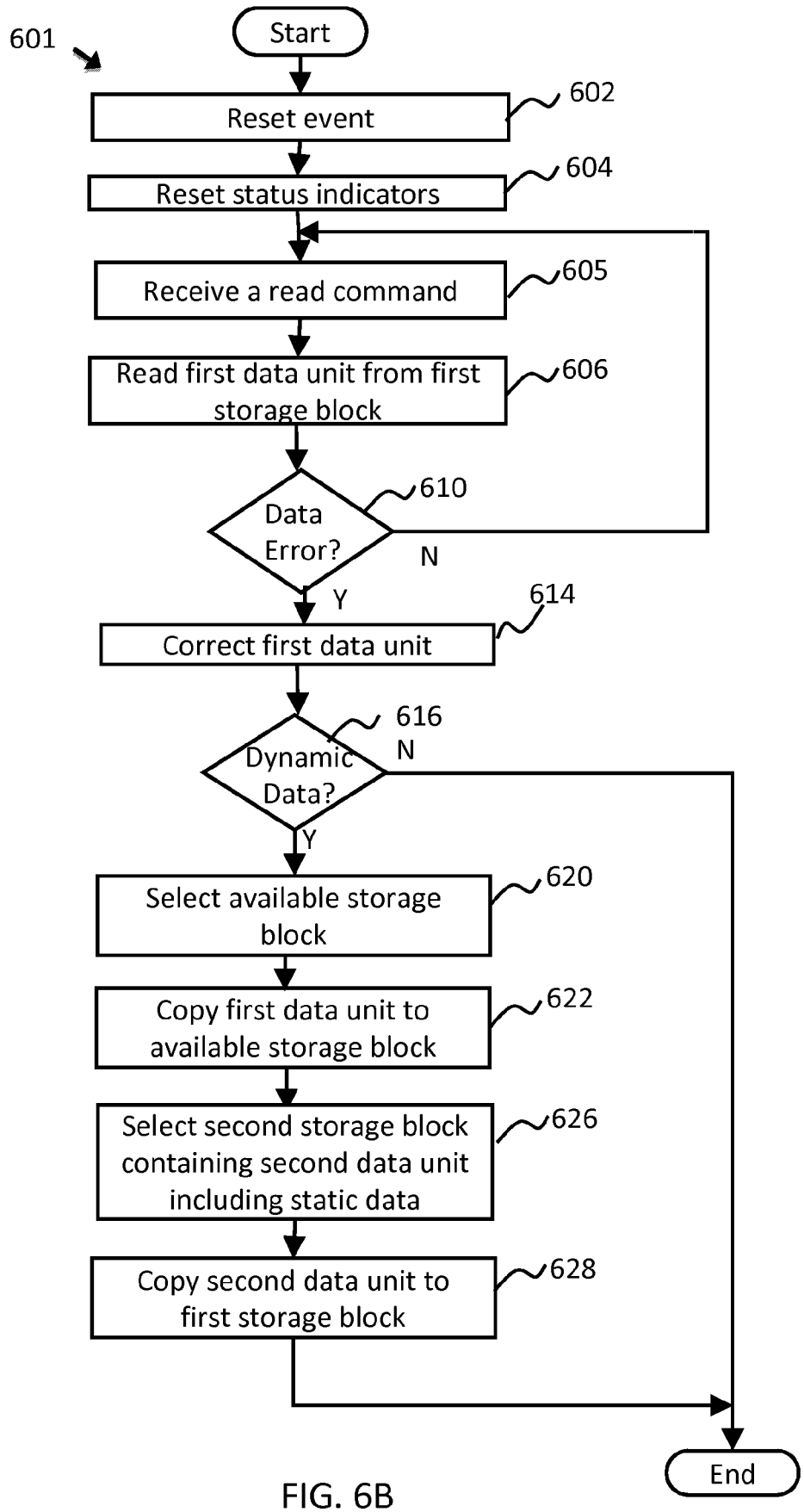
FIG. 6B is a flow chart for a method of wear-leveling in a flash storage device, in accordance with an embodiment of the present disclosure.

FIG. 6B illustrates an alternative method 601 of wear-leveling in the flash storage device 100, in accordance with an embodiment of the present disclosure. In step 602, the flash storage device 110 is powered-on or experiences a reset event. The method 601 then proceeds to step 604.

In step 604, the controller 115 may reset the read status indicators $305_1$-$305_n$ and the write status indicators $310_1$-$310_n$ in the status table 135. The flash controller 115 may also reset the error status indicators $315_1$-$315_n$ in the status table 135. In one embodiment, the flash controller receives a command for a read operation from the host 105 in step 605. In step 606, the flash controller 115 reads a first data unit from a first storage block $125_1$ in the flash storage device 110 based on the command. The method 601 then proceeds to step 610.

In step 610, the flash controller 115 determines whether a data error has occurred as a result of reading the first data unit from the first storage block $125_1$. If the controller determines a data error has occurred as a result of the read operation, the method 601 proceeds to step 614, otherwise the method 601 proceeds back to step 605 to wait for the next command from the host 105.

In step 614, the flash controller 115 corrects the data error in the first data unit and the method 601 then proceeds to step 616.

In step 616, the flash controller 115 determines whether the first data unit includes dynamic data. If the flash controller 115 determines the first data unit contains dynamic data, the method 601 proceeds to stop 620, otherwise the method 601 ends.

In step 620, the flash controller 115 selects an available storage block $125_4$ in the flash storage device 110. The method 601 then proceeds to step 622.

In step 622, the flash controller 115 moves the data unit by copying the data unit from storage block $125_1$, which has been corrected in step 614 to the selected storage block $125_4$, for example. The flash controller 115 may also perform an erase operation on storage block $125_1$ at this stage. Additionally, the flash controller 115 updates the logical block address table 130. The method 601 then proceeds to step 626.

In step 626, the flash controller 115 selects a second storage block $125_2$ in the flash storage device 110, which contains a second data unit including static data and then proceeds to step 628.

In step 628, the flash controller 115 moves the second data unit from the second storage block $125_2$ to the first storage block $125_1$ by copying the data unit from storage block $125_2$ to storage block $125_1$, for example, and performs an optional erase operation on the second storage block $125_2$. The method 601 then ends. In various embodiments, the steps of either method 600 or method 601 may be performed in a different order than that described above with reference to FIGS. 6A and 6B. In some embodiments, method 600 or method 601 may include more or fewer steps than those steps illustrated in FIGS. 6A and 6B. In other embodiments, some or all of the steps of method 600 or method 601 may be performed in parallel with each other or substantially simultaneously with each other. While various storage blocks such as storage blocks $125_1$ and $125_4$ are described in the above method, they are given by way of example only. The data can be read and written to any storage blocks $125_1$-$125_n$. For example, in step 606, the flash controller 115 can read a first data unit from storage block $125_n$ instead of storage block $125_1$. Similarly, in step 620, the flash controller 115 may select another available storage block (e.g., available storage block $125_5$ instead of storage block $125_4$).

Figure 7A:
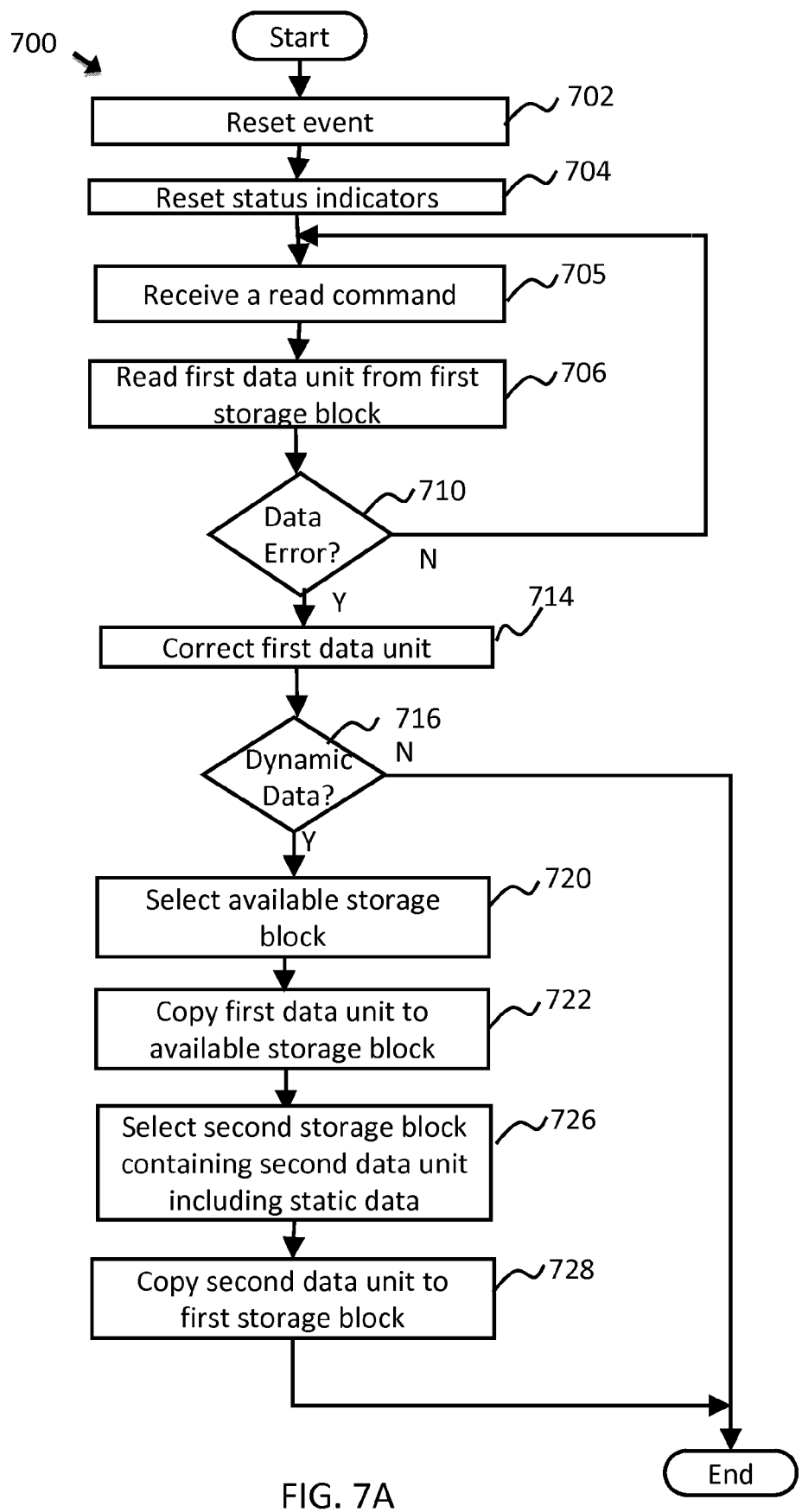
FIG. 7A is a flow chart for a method of wear-leveling in a flash storage system, in accordance with an embodiment of the present disclosure.

FIG. 7A illustrates a method 700 of wear-leveling in the flash storage system 400, in accordance with an embodiment of the present disclosure. In step 702, the flash storage system 400 is powered-on or experiences a reset event. The method 700 then proceeds to step 704.

In step 704, the system controller 405 may reset the read status indicators $305_1$-$305_n$ and the write status indicators $310_1$-$310_n$ in the status tables 135. The system controller 405 may also reset the error status indicators $315_1$-$315_n$ in the status tables 135. In one embodiment, the system controller 405 receives a read operation or command from the host 105 in step 705 and performs the read operation on the first storage block $125_1$ to read the first data unit from the storage block $125_1$ in flash storage device $110_1$ in step 706. The method 700 then proceeds to step 710.

In step 710, the system controller 405 determines whether a data error has occurred as a result of reading the first data unit from the first storage block $125_1$. If the system controller 405 determines a data error has occurred as a result of reading the first data unit from the first storage block $125_1$, the method 700 proceeds to step 714, otherwise the method 700 proceeds back to step 705 to wait for the next operation or command.

In step 714, once the data error has detected in the first data unit, the system controller 405 corrects the data error in the first data unit. The method 700 then proceeds to step 716.

In step 716, the system controller 405 determines whether the first data unit includes dynamic data. In one embodiment, the system controller 405 determines the first data unit includes dynamic data if the count in the error status indicator $315_1$ of the first storage block $125_1$ exceeds the threshold value and the write status indicator $310_1$ of the first storage block $125_1$ is set. If the system controller 405 determines the first data unit contains dynamic data, the method 700 proceeds to step 720, otherwise the method 700 ends.

In step 720, the system controller 405 selects an available storage block in one of the flash storage devices. For example, the available storage block may be a spare storage block $125_4$ in the same flash storage device $110_1$. The system controller 405 may use a free storage block indicator $320_4$ in the status table 135 to select the available storage block $125_4$. In another embodiment, the system controller 405 may use a different free storage block indicator to select another available storage block that is in another flash storage device, such as storage block $125'_4$ of flash storage device $110_2$, for example. The method 700 then proceeds to step 722.

In step 722, the system controller 405 moves the data unit by copying the, data unit from storage block $125_1$, which has been corrected in step 714, to the available storage block $125_4$ or $125'_4$. The system controller 405 may also perform an erase operation on storage block $125_1$ at this stage. Additionally, the system controller 405 updates the virtual address table 415. With reference to FIGS. 2 and 5A, the system controller 405 identifies the virtual address $500_1$ that is mapped to the first storage block $125_1$ and maps the virtual address $500_1$ to the available storage block $125_4$ or $125'_4$. The method 700 then proceeds to step 726.

In step 726, the system controller 405 selects a storage block $125_2$ in one of the flash storage devices 110, which contains a second data unit including static data. In one embodiment, the system controller 405 selects the second storage block $125_2$ by identifying a write status indicator $310_2$ that is not set in the status table 135 and identifying the storage block $125_2$ associated with the write status indicator $310_2$. In another embodiment, the system controller 405 selects the second storage block $125_2$ by identifying a write status indicator $310_2$ that is not set in the status table 135 and a read status indicator $305_2$ that is set in the status table 135, and identifying the storage block $125_2$ associated with the write status indicator $310_2$ and the read status indicator $305_2$. The method 700 then proceeds to step 728.

In step 728, the system controller 405 moves the second data unit from the second storage block $125_2$ to the first storage block $125_1$ by copying the data unit from storage block $125_2$ to storage block $125_1$, for example. The system controller 405 may also perform an erase operation on storage block $125_2$. Additionally, the system controller 405 updates the virtual address table 415. In this process, the system controller 405 identifies the virtual address $500_2$ that is mapped to the second storage block $125_2$ and maps the virtual address $500_2$ to the first storage block $125_1$. In one embodiment, the system controller 405 also erases the second storage block $125_2$. The method 700 then ends.

Figure 7B:
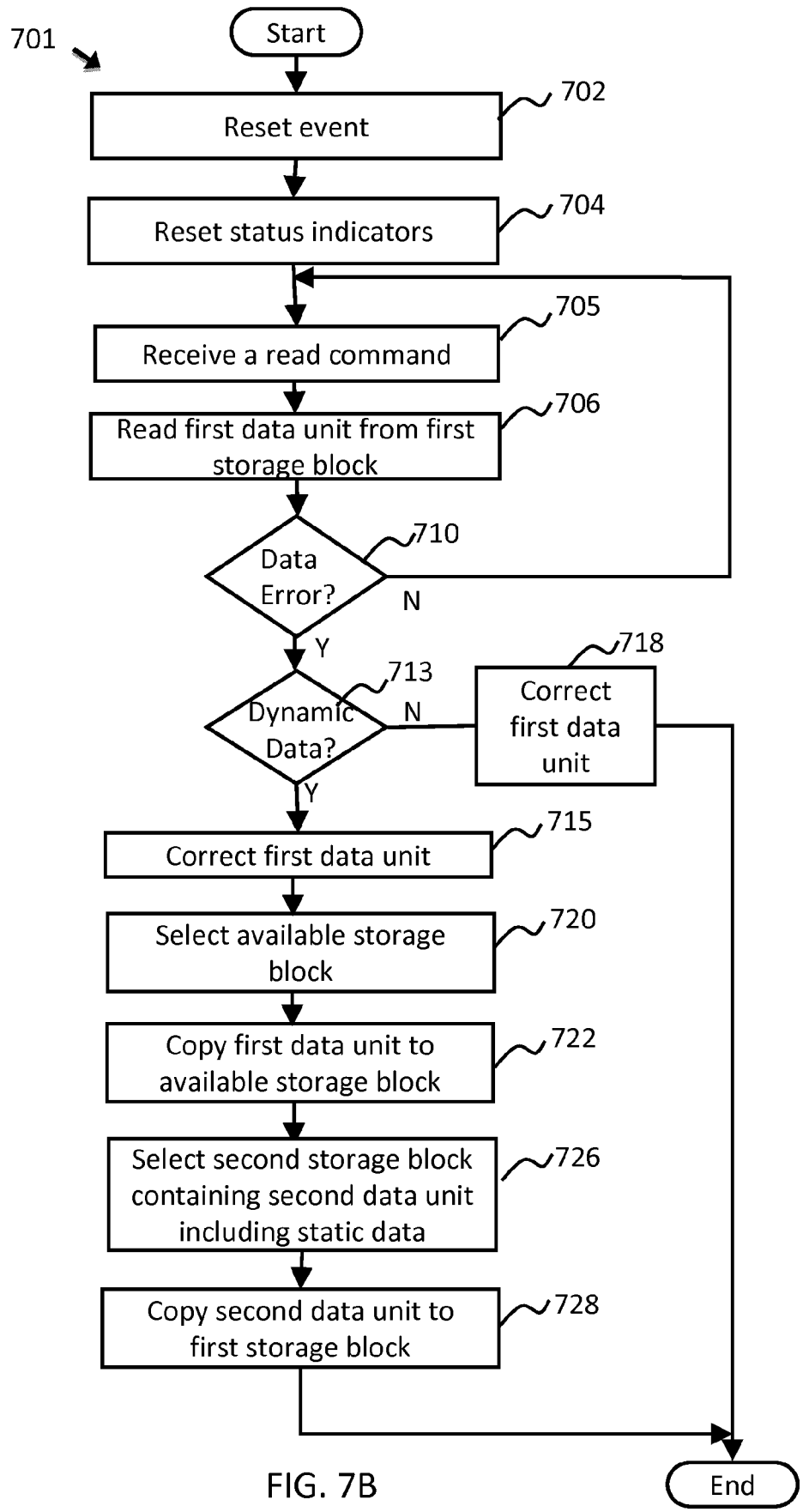
FIG. 7B is a flow chart for a method of wear-leveling in a flash storage system, in accordance with another embodiment of the present disclosure.

In various embodiments, the steps of the method 700 may be performed in a different order than that described above with reference to FIG. 7A. In some embodiments, the method 700 may include more or fewer steps than those steps illustrated in FIG. 7A. In other embodiments, some or all of the steps of the method 700 may be performed in parallel with each other or substantially simultaneously with each other. In yet other embodiments, the sequence of steps 710, 714, and 716 may be performed in different order. For example, with reference to FIG. 7B, an alternative method 701 of wear-leveling is shown. Method 701 starts with steps 702, 704, 705, 706, and 710, which are similar to those of method 700 as described above. However, after step 710 is performed, the method 701 proceeds to step 713 if a data error has occurred, otherwise the method 701 proceeds back to step 705.

In step 713, the system controller 405 determines whether the first data unit includes dynamic data. If the system controller 405 determines the first data unit contains dynamic data, the method 700 proceeds to step 715, otherwise the method 700 proceeds to step 718, where the system controller 405 corrects the data error in the first data unit, sends the corrected data to the host, and the method 701 ends.

In step 715, the system controller 405 corrects the data error in the first data unit and the method 701 proceeds to steps 720, 722, 726, and 728 as described before.

Figure 7C:
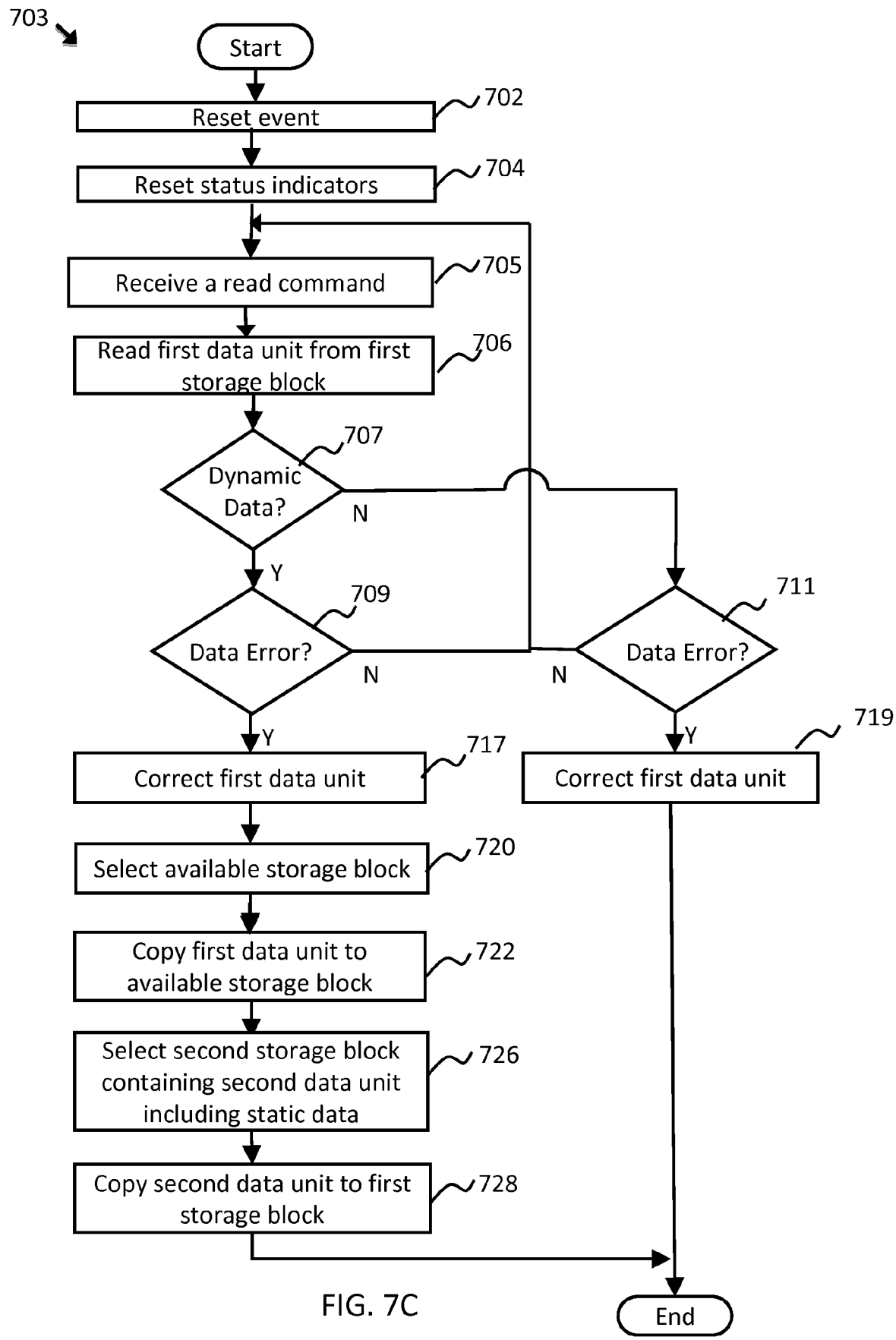
FIG. 7C is a flow chart for a method of wear-leveling in a flash storage system, in accordance with yet another embodiment of the present disclosure.

With reference to FIG. 7C, another alternative method 703 of wear-leveling is shown. Method 703 starts with steps 702, 704, 705, and 706, which are similar to those of method 700 as described above. However, after step 706 is performed, the method 703 proceeds to step 707.

In step 707, the system controller 405 determines whether the first data unit includes dynamic data. If the system controller 405 determines the first data unit contains dynamic data, the method 703 proceeds to step 709, otherwise the method 703 proceeds to step 711.

In step 711, the system controller 405 determines whether a data error has occurred as a result of reading the first data unit. If the system controller 405 determines a data error has occurred, the method 703 proceeds to step 719, otherwise the method 703 proceeds back to step 705.

In step 719, the system controller 405 corrects the data error in the first data unit, sends the corrected data to the host, and the method 703 ends.

In step 709, the system controller 405 determines whether a data error has occurred as a result of reading the first data unit. If the system controller 405 determines a data error has occurred, the method 703 proceeds to step 717, otherwise the method 703 proceeds back to step 705.

In step 717, the system controller 405 corrects the data error in the first data unit and continues to proceed to steps 720, 722, 726, and 728 as previously described.

While various storage blocks such as storage blocks $125_1$ and $125_4$ are described in the above method, they are given by way of example only. The data can be read and written to any storage blocks $125_1$-$125_n$. For example, in step 706, the system controller 405 may read a first data unit from storage block $125_n$ instead of storage block $125_1$. Similarly, in step 720, the system controller 405 may select another available storage block (e.g., available storage block $125_5$ of the same flash device $110_1$ or storage block $125'_4$ of another flash device $110_2$ instead of storage block $125_4$).

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A flash storage device comprising:
a plurality of storage blocks; and
a controller, wherein the controller is configured to:
read a first data unit in a first storage block of the plurality of storage blocks;
detect that a read data error has occurred in the first data unit and, in response, correct the first data unit; and
detect that the first storage block of the plurality of storage blocks is a dynamic storage block and, in response:
select an available storage block of the plurality of storage blocks;
move the first data unit from the first storage block to the available storage block;
select a second storage block of the plurality of storage blocks comprising static data; and
copy the static data into the first storage block.

2. The flash storage device of claim 1, wherein the controller is configured to detect that the first storage block is a dynamic storage block if a read data error count associated with the first storage block exceeds a threshold value and a write status indicator associated with the first storage block is set.

3. The flash storage device of claim 1, wherein the controller is configured to select the second storage block comprising static data based on a write status indicator associated with the second storage block that is not set in a status table.

4. The flash storage device of claim 2, wherein the controller is further configured to modify the threshold value to cause the count of the read data error of at least one storage block of the plurality of storage blocks not to exceed the threshold value.

5. The flash storage device of claim 2, wherein the controller is further configured to reset the read data error count after the flash storage device is powered-on and before the controller performs a read operation.

6. The flash storage system of claim 3, wherein the controller is further configured to reset the write status indicator after the flash storage device is powered on and before the controller performs a write operation.

7. The flash storage device of claim 1, wherein the controller is configured to detect that the first storage block is a dynamic storage block based on a write status indicator that indicates the controller has written data to the first storage block since the flash storage device was last powered-on.

8. The flash storage device of claim 1, wherein the controller is configured to select the second storage block comprising static data based on a write status indicator that indicates the controller has not written data to the second storage block since the flash storage device was last powered-on.

9. A flash storage device comprising:
a plurality of storage blocks; and
a controller in communication with the plurality of storage blocks, wherein the controller is configured to:
read a first data unit from a first storage block of the plurality of storage blocks;
determine if a data error has occurred from a read operation of the first storage block and if the first storage block contains dynamic data, and in response the controller is further configured to:
correct the first data unit;
move the first data unit from the first storage block to an available storage block;
select a second storage block of the plurality of storage blocks, the second storage block containing a second data unit including static data; and
move the second data unit from the second storage block to the first storage block.

10. The flash storage device of claim 9, wherein the controller is configured to detect that the first storage block contains dynamic data based on a write status indicator that indicates the controller has written data to the first storage block since the flash storage device was last powered-on.

11. The flash storage device of claim 9, wherein the controller is configured to select the second storage block comprising static data based on a write status indicator that indicates the controller has not written data to the second storage block since the flash storage device was last powered-on.

12. The flash storage device of claim 9, wherein the controller is further configured to correct the first data unit if the data error has occurred from the read operation of the first storage block.

13. The flash storage device of claim 10, wherein the controller is further configured to reset the write status indicator after the flash storage device is powered on and before the controller performs a write operation.

14. A method implemented in a flash storage device comprising:
reading a first data unit from a first storage block of a plurality of storage blocks;
if a data error has occurred in the first data unit as a result of a read operation:
correcting the data error in the first data unit; and
maintaining an error status indicator, wherein the error status indicator comprises a count of the data errors of the first storage block;
if the first storage block contains dynamic data and the error status indicator of the first storage block exceeds a threshold value:
moving the first data unit from the first storage block to an available storage block; and
moving a second data unit containing static data of a second storage block to the first storage block.

15. The method of claim 14, wherein the controller is configured to detect that the first storage block contains dynamic data based on a write status indicator that indicates the controller has written data to the first storage block since the flash storage system was last powered-on.

16. The method of claim 14, wherein the controller is configured to select the second storage block comprising static data based on a write status indicator that indicates the controller has not written data to the second storage block since the flash storage system was last powered-on.

17. The method of claim 14, wherein the first data unit is associated with an address mapped to the first storage block before the first data unit is moved to the available storage block, and wherein moving the first data unit from the first data block to the available storage block comprises mapping the address associated with the first data unit to the available storage block.

18. The method of claim 14, wherein the second data unit is associated with an address mapped to the second storage block before the second data unit is moved to the first storage block, and wherein moving the second data unit to the first storage block comprises mapping the address associated with the second data unit to the first storage block.

19. The method of claim 14, further comprising setting the threshold value to a new value such that the error status indicator does not exceed the new value.

20. The method of claim 14, wherein moving the first data unit from the first storage block to the available storage block comprises writing the first data unit to the available storage block after correcting the data error in the first data unit; and erasing the first storage block.

* * * * *